(12) United States Patent
Weber et al.

(10) Patent No.: US 11,905,166 B2
(45) Date of Patent: Feb. 20, 2024

(54) PRODUCTION METHOD FOR A MICROMECHANICAL COMPONENT

(71) Applicant: Robert Bosch GmbH, Stuttgart (DE)

(72) Inventors: Heribert Weber, Nuertingen (DE); Peter Schmollngruber, Aidlingen (DE); Thomas Friedrich, Moessingen-Oeschingen (DE); Andreas Scheurle, Leonberg (DE); Joachim Fritz, Tuebingen (DE); Sophielouise Mach, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 236 days.

(21) Appl. No.: 17/446,898

(22) Filed: Sep. 3, 2021

(65) Prior Publication Data
US 2022/0081285 A1 Mar. 17, 2022

(30) Foreign Application Priority Data
Sep. 15, 2020 (DE) .......................... 102020211554.0

(51) Int. Cl.
*B81C 1/00* (2006.01)
*B81B 3/00* (2006.01)
*H04R 3/00* (2006.01)

(52) U.S. Cl.
CPC ........ *B81C 1/00158* (2013.01); *B81B 3/0021* (2013.01); *B81B 2201/0257* (2013.01); *B81B 2201/0264* (2013.01); *B81B 2203/0127* (2013.01); *B81B 2203/0315* (2013.01); *B81C 2201/016* (2013.01); *B81C 2201/0132* (2013.01); *H04R 3/00* (2013.01)

(58) Field of Classification Search
CPC ........ B81C 1/00158; B81C 2201/0132; B81C 2201/016; B81B 3/0021; B81B 2201/0257; B81B 2201/0264; B81B 2203/0127; B81B 2203/0315
See application file for complete search history.

(56) References Cited

U.S. PATENT DOCUMENTS

2012/0018819 A1 1/2012 Ferrera et al.
2015/0175409 A1 6/2015 Zhang et al.

FOREIGN PATENT DOCUMENTS

DE 102004043356 A1 3/2006

*Primary Examiner* — Samuel A Gebremariam
(74) *Attorney, Agent, or Firm* — NORTON ROSE FULBRIGHT US LLP; Gerard A. Messina

(57) ABSTRACT

A production method for a micromechanical component for a sensor or microphone device. The method includes: patterning a plurality of first trenches through a substrate surface of a monocrystalline substrate made of at least one semiconductor material using anisotropic etching, covering the lateral walls of the plurality of first trenches with a passivation layer, while bottom areas of the plurality of first trenches are kept free or are freed of the passivation layer, etching at least one first cavity, into which the plurality of first trenches opens, into the monocrystalline substrate using an isotropic etching method, in which an etching medium of the isotropic etching method is conducted through the plurality of first trenches, and by covering the plurality of first trenches by epitaxially growing a monocrystalline sealing layer on the substrate surface of the monocrystalline substrate made of the at least one identical semiconductor material as the monocrystalline substrate.

3 Claims, 10 Drawing Sheets

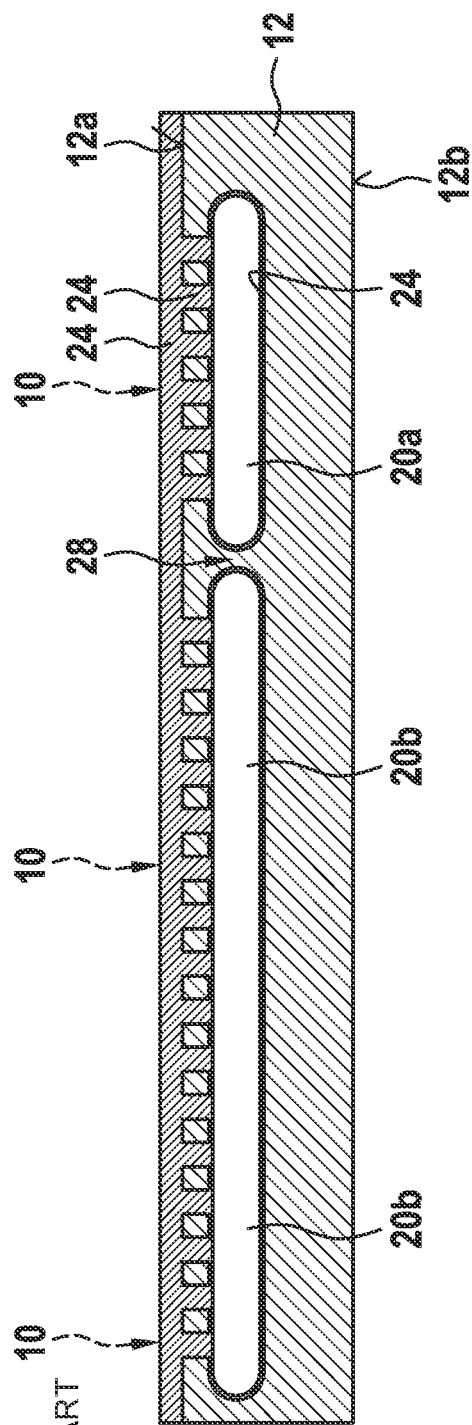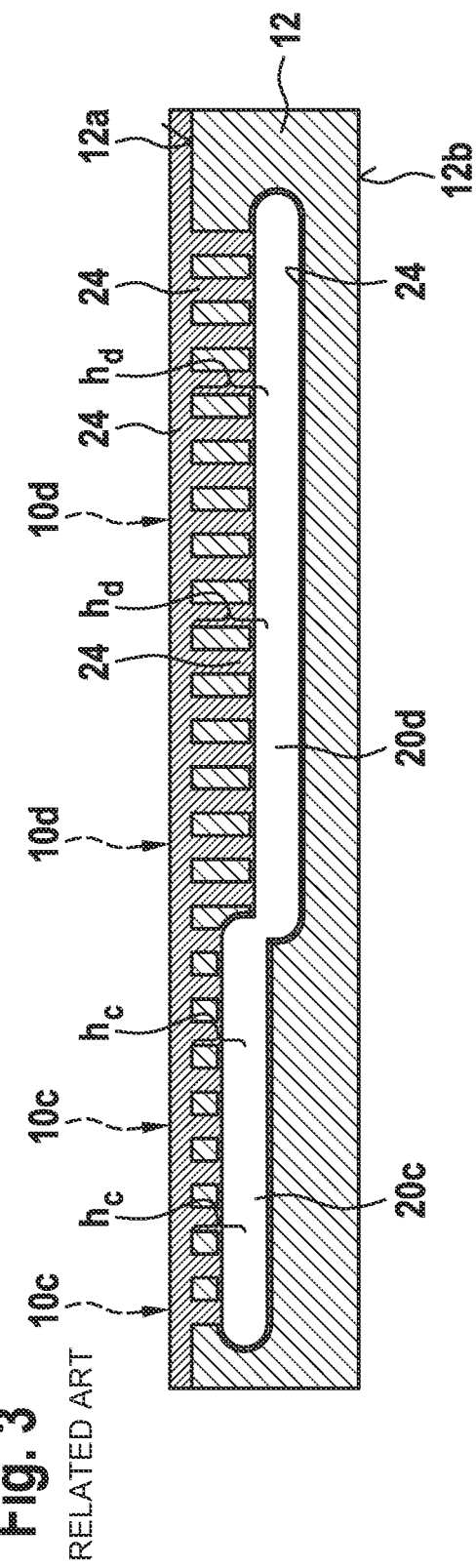

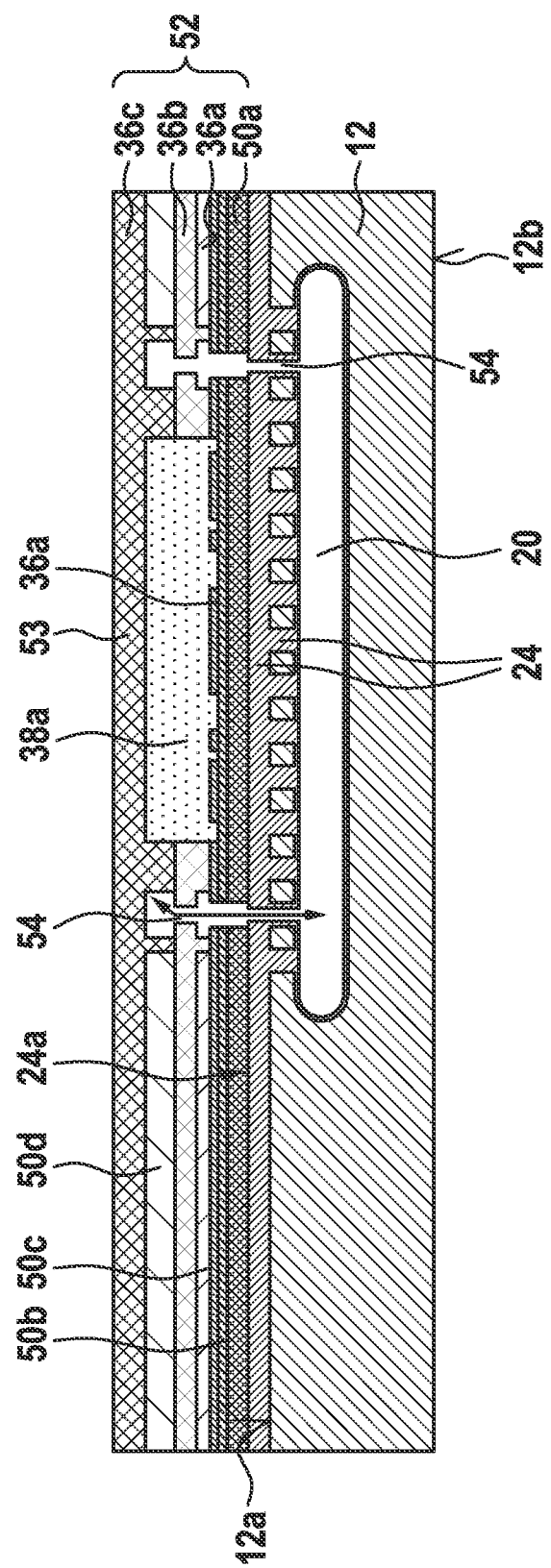

PRODUCTION METHOD FOR A MICROMECHANICAL COMPONENT

CROSS REFERENCE

The present application claims the benefit under 35 U.S.C. § 119 of German Patent Application No. DE 102020211554.0 filed on Sep. 15, 2020, which is expressly incorporated herein by reference in its entirety.

FIELD

The present invention relates to a production method for a micromechanical component for a sensor or microphone device. The present invention also relates to a micromechanical component for a sensor or microphone device.

BACKGROUND INFORMATION

German Patent Application No. DE 10 2004 043 356 A1 describes a method for forming a trenched cavity. To form a trenched cavity, first a plurality of trenches is patterned through a substrate surface of a substrate, for example made of a semiconductor material such as silicon, using an anisotropic etching process. Subsequently, using an isotropic etching process, the trenched cavity, into which the plurality of trenches opens, is etched into the substrate, for the purpose of which the etching medium used for carrying out the isotropic etching process is conducted through the plurality of trenches.

Additional methods for forming trenched cavities are described in U.S. Patent Application Publication Nos. US 2012/0018819 A1 and US 2015/0175409 A1.

SUMMARY

The present invention provides a production method for a micromechanical component for a sensor or microphone, and a micromechanical component for a sensor or microphone device.

The present invention provides advantageous embodiments for forming a cavity/a hollow space at any depth of a monocrystalline substrate made of at least one semiconductor material and for covering/sealing the at least one cavity using an arbitrarily thick monocrystalline sealing layer made of the at least one identical semiconductor material as the monocrystalline substrate. It is expressly pointed out that constrictions conventionally frequently occurring in a cavity cover do not occur when using the present invention. For this reason, a micromechanical component produced by way of the present invention may be used advantageously for a sensor or microphone device such as a pressure sensor, for example.

The present invention may also be used for forming multiple "levels of cavities", the at least one first cavity being formed on a first side of the monocrystalline sealing layer and the at least one second cavity being formed on a second side of the monocrystalline sealing layer facing away from the at least one first cavity.

Additionally, the at least one connecting channel achieves an "enlargement of a cavity volume", which, as is explained in more detail below, may be used for an exchange of gas between the at least one first cavity and the at least one second cavity. This makes it possible for example to prevent outgassing effects from resulting in a functional impairment of a sensor or microphone device implemented by the produced micromechanical component. In one advantageous specific embodiment of the production method, for the monocrystalline substrate made of silicon, the monocrystalline sealing layer is epitaxially grown as a monocrystalline silicon layer. The epitaxial growth of the respective monocrystalline silicon layer is thus readily feasible.

The advantages described above are also ensured in the case of a corresponding micromechanical component for a sensor or microphone device.

BRIEF DESCRIPTION OF THE DRAWINGS

Additional features and advantages of the present invention are explained below with reference to the figures.

FIG. 2 shows a schematic illustration of a micromechanical component, which does not fall within the scope of the present invention.

FIG. 3 shows a schematic illustration of a micromechanical component, which does not fall within the scope of the present invention.

FIG. 7 shows a schematic illustration of a first specific embodiment of the micromechanical component according to the present invention.

DETAILED DESCRIPTION OF EXAMPLE EMBODIMENTS

Figure 1A:
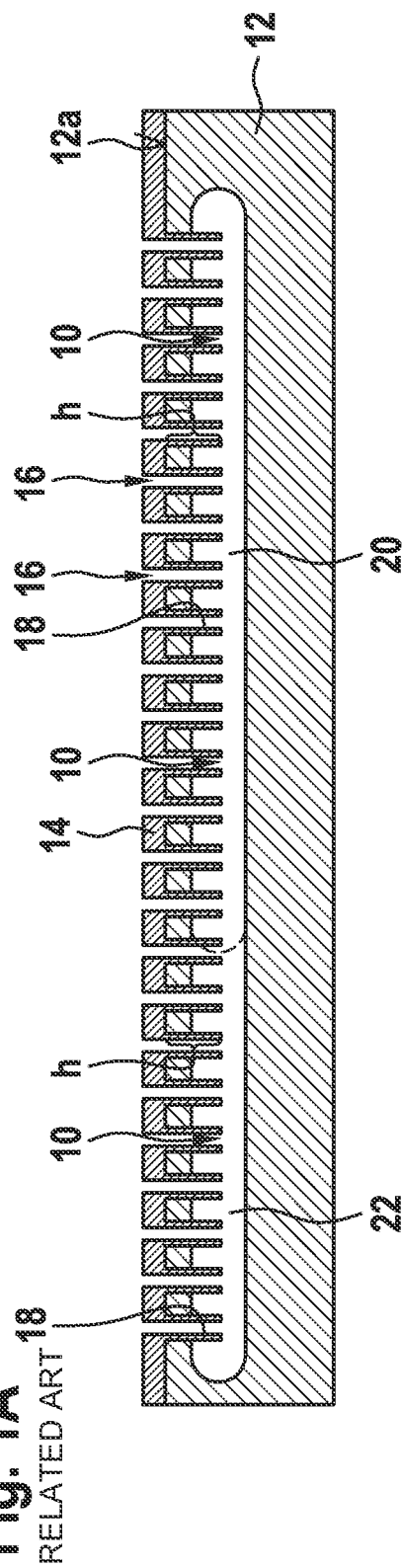
FIGS. 1A, 1B, 1C and 1D show schematic illustrations of layer sequences for explaining method steps, which do not fall within the scope of the present invention.

FIGS. 1A through 1D show schematic illustrations of method steps, which do not fall within the scope of the present invention.

In the production method described below, a plurality of trenches 10 are patterned through a substrate surface 12a of a monocrystalline substrate 12 made of at least one semiconductor material. The plurality of trenches 10 are patterned using an anisotropic etching method. Monocrystalline substrate 12 may be a monocrystalline silicon substrate, for example. In this case, any conventional anisotropic etching method for a conventional monocrystalline silicon substrate may be carried out for patterning the plurality of trenches 10.

Prior to patterning trenches 10, an etching mask 14 may be formed on substrate surface 12a of monocrystalline substrate 12, whose straight-through cut-outs 16 define the positions, shapes and dimensions of the trenches 10 to be etched later. Etching mask 14 may be made of silicon dioxide for example, which in the case of a monocrystalline substrate 12 made of silicon may be produced in particular by thermal oxidation. Standard semiconductor processes may be used to form the straight-through cut-outs 16 in etching mask 14. Trenches 10 may then be etched having at least a height h, which is respectively definable by a duration of the isotropic etching method.

The lateral walls of the plurality of trenches 10 are covered following their formation by a passivation layer 18, while bottom areas of the plurality of trenches 10 are kept free or are freed of passivation layer 18. Passivation layer 18 may be for example a silicon dioxide layer, which in the case of a monocrystalline substrate 12 may be formed from silicon in particular by thermal oxidation, it being subsequently possible to free the bottom areas of trenches 10 of passivation layer 18 using an anisotropic etching process such as an anisotropic plasma etching process, for example. (An unwanted exposure of substrate surface 12a during the anisotropic etching process may be prevented by a sufficient layer thickness of etching mask 14 made of silicon dioxide.) As an alternative to a passivation layer 18 made of silicon dioxide, it is also possible to use a polymer layer as passivation layer 18.

In a further method step, at least one cavity 20 and 22, into which the plurality of trenches 10 opens, is etched into monocrystalline substrate 12 using an isotropic etching method, in which an etching medium of the isotropic etching method is conducted through the plurality of trenches 10. FIG. 1A shows an intermediate product of the production method following the etching of the at least one cavity 20 and 22.

As the isotropic etching method, it is possible to perform for example a plasma etching process, such as specifically an SF6 plasma etching process, or a gas phase etching process, in particular a ClF3 gas phase etching process or an XeF2 gas phase etching process. All of the isotropic etching methods mentioned here ensure that in a monocrystalline substrate 12 made of silicon, material of the monocrystalline substrate 12 is isotropically removed starting from the bottom areas of trenches 10 kept free or freed. A sufficiently small distance between two adjacent trenches 10 ensures that the etching fronts starting from the respective bottom areas of trenches 10 meet each other.

If the etching of the at least one cavity 20 and 22 is performed using etching mask 14 and/or passivation layer 18, etching mask 14 and/or passivation layer 18 are removed following the etching of the at least one cavity 20 or 22. If etching mask 14 and/or passivation layer 18 are made of silicon dioxide, it is possible to perform e.g. an HF gas phase etching process to remove the respective layer 14 or 18 reliably. Monocrystalline surfaces made of the at least one semiconductor material of monocrystalline substrate 12 are now exposed on substrate surface 12a, on the lateral walls of trenches 10 and possibly also on the lateral walls of the at least one cavity 20 and 22. For this reason, the plurality of trenches 10 may now be covered by epitaxial growth of a monocrystalline sealing layer 24 made of the at least one identical semiconductor material as the monocrystalline substrate 12 on substrate surface 12a of monocrystalline substrate 12. In particular, the plurality of trenches 10 may now be completely filled/closed by epitaxial growth of the monocrystalline sealing layer 24 made of the at least one identical semiconductor material as the monocrystalline substrate 12. For example, for monocrystalline substrate 12 made of silicon, monocrystalline sealing layer 24 is epitaxially grown as a monocrystalline silicon layer. Optionally, following the epitaxial deposition of the monocrystalline sealing layer 24, an annealing step may be performed in order to smooth out unwanted topographies/spikes in the at least one cavity 20 and 22. A monocrystalline silicon layer is possibly epitaxially grown even on the walls of the at least one cavity 20 and 22 until the plurality of trenches 10 is completely closed.

Figure 1B:
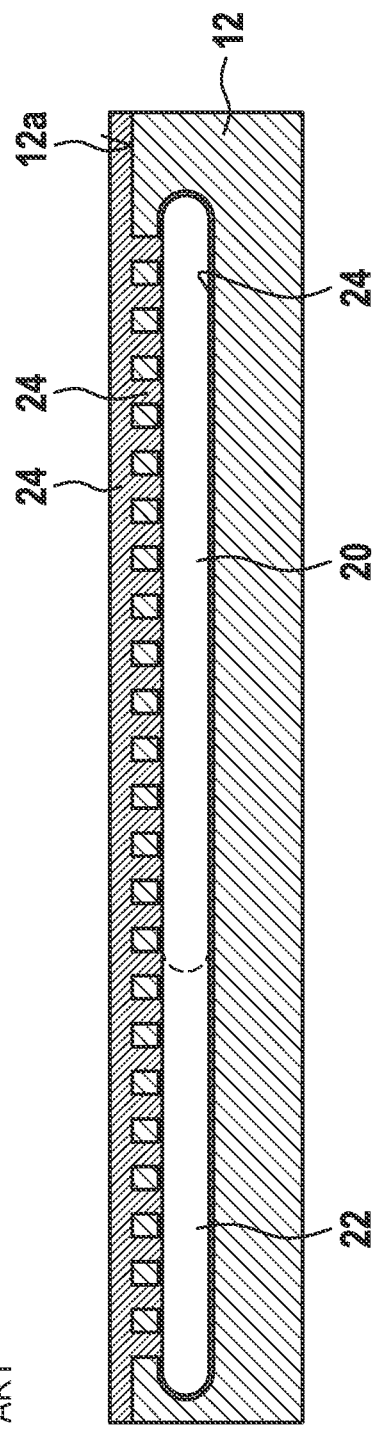

FIG. 1B shows an intermediate product of the production method following the epitaxial growth of the monocrystalline sealing layer 24 made of the at least one identical semiconductor material as the monocrystalline substrate 12, whereby trenches 10 are closed at substrate surface 12a by the grown sealing layer 24. If desired, trenches 10 may be filled completely at substrate surface 12a by the grown sealing layer 24. Following the closure of the trenches 10, no further material is able to grow epitaxially on the walls of the at least one cavity 20 and 22. The at least one cavity 20 and 22 may therefore be referred to as a hollow space, which is surrounded on all sides by the at least one semiconductor material of the monocrystalline substrate 12 in monocrystalline form.

Figure 1C:
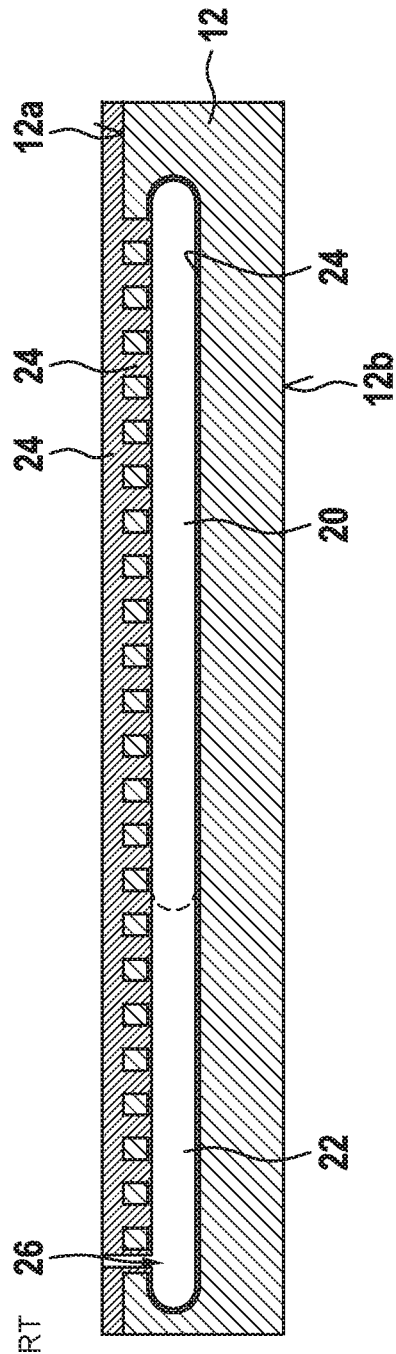
Figure 1D:
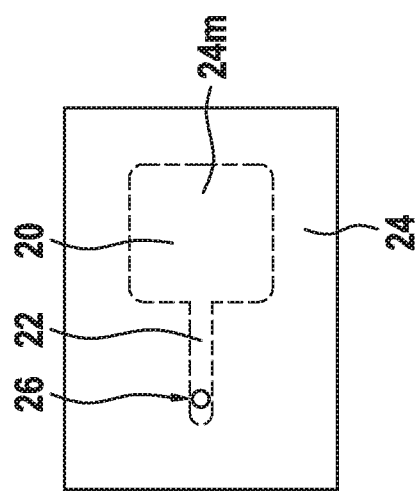

FIGS. 1C and 1D show the micromechanical component following an (optional) patterning of an access opening 26 through the monocrystalline sealing layer 24, FIG. 1C showing a cross section through the monocrystalline sealing layer 24 and FIG. 1D showing a top view onto the monocrystalline sealing layer.

Alternatively, access opening 26 may also be patterned through a back side 12b of monocrystalline 12 facing away from substrate surface 12a.

Following the patterning of access opening 26, a first cavity 22 for example, into which access opening 26 opens, may be used as access channel 22 for a second cavity, into which first cavity 22 opens. Second cavity 20 may be used for example as a sensor cavity 20 of the micromechanical component. The position of the opening of the at least one access channel 22 into the at least one second cavity 20 may be selected in such a way that a stress-related influence on the function and/or the mechanical stability of an area of the monocrystalline sealing layer 24, which is used later as diaphragm 24m, may be minimized/excluded. Via access opening 26 and access channel 22, a defined internal pressure may be set in sensor cavity 20 and/or at least one gas may be introduced into sensor cavity 20. Following the setting of the desired internal pressure and/or the introduction of the at least one gas into sensor cavity 20, access opening 26 may be sealed in a media-tight manner. This may be done for example with the aid of a laser reseal method by melting the at least one semiconductor material of monocrystalline substrate 12 and/or of sealing layer 24 in the area of access opening 26.

The micromechanical component illustrated in FIGS. 1C and 1D is used, by way of example, as a pressure sensor, for the purpose of which a partial area 24m of monocrystalline sealing layer 24 is used as a pressure-sensitive diaphragm 24m. In a further optional method step, at least one piezoresistive resistor (not shown) may be introduced into the partial area 24m of monocrystalline sealing layer 24 that is used as pressure-sensitive diaphragm 24m. The micromechanical component of FIGS. 1C and 1D may thus be in particular a piezoresistive pressure sensor.

FIG. 2 shows a schematic illustration of a micromechanical component that does not fall within the scope of the present invention.

The micromechanical component illustrated schematically in FIG. 2 is produced by way of the method steps explained with reference to FIGS. 1A and 1B. It therefore comprises a monocrystalline substrate 12 made of at least one semiconductor material, a plurality of trenches 10 being patterned through a substrate surface 12a of the monocrystalline substrate 12, which opens into at least one cavity 20a and 20b etched into monocrystalline substrate 12, a monocrystalline sealing layer 24 made of the at least one identical semiconductor material as the monocrystalline substrate 12, which is epitaxially grown on substrate surface 12a of monocrystalline substrate 12, covering the plurality of trenches 10. In particular, the plurality of trenches 10 may be completely filled/closed by the epitaxially grown monocrystalline sealing layer 24. As may be seen in FIG. 2, by way of the method steps explained above, it is also possible to form multiple cavities 20a and 20b in the monocrystalline substrate 12, which do not open into one another. Between two adjacent cavities 20a and 20b, which do not open into each other, there may exist respectively a separation area 28 made of the at least one semiconductor material of the monocrystalline substrate 12.

Regarding further features of the micromechanical component of FIG. 2, reference is made to the description of FIGS. 1A through 1D.

FIG. 3 shows a schematic illustration of a micromechanical component that does not fall within the scope of the present invention.

In the micromechanical component of FIG. 3, a first cavity 20c and a second cavity 20d are formed at different heights within the monocrystalline substrate 12 by way of the method steps explained with reference to FIGS. 1A and 1B. For this purpose, first trenches 10c, which open into first cavity 20c, are formed having a first height $h_c$, which is unequal to a second height $h_d$ of second trenches 10d opening into cavity 20d. In this manner, it is possible to choose to situate cavities 20c and 20d so that they open into each other or are separated from each other.

Regarding further features of the micromechanical component of FIG. 3, reference is made to the description of FIGS. 1A through 1D and of FIG. 2.

Figure 4A:
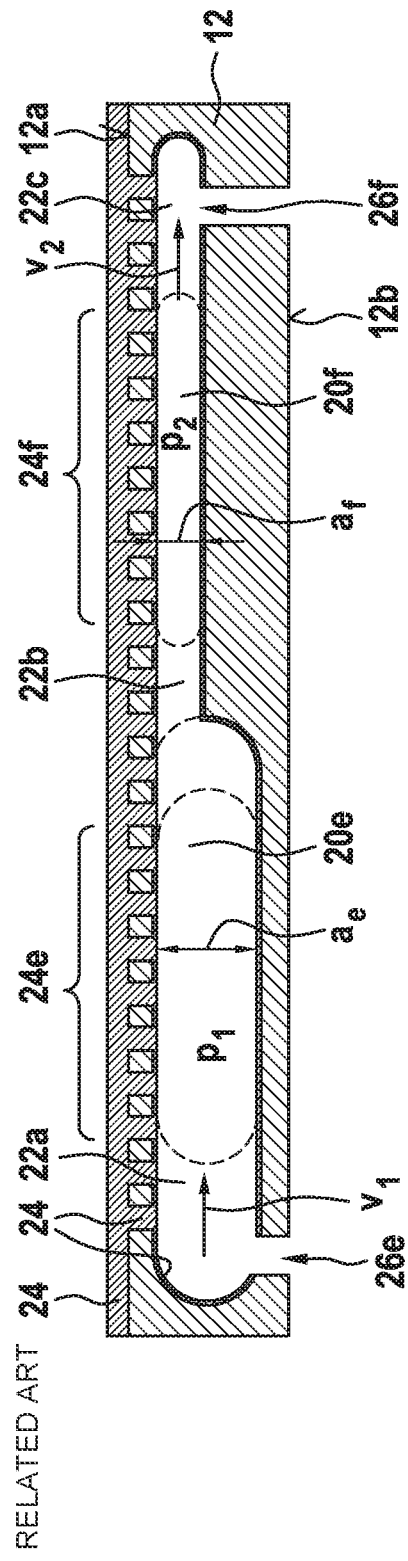
FIGS. 4A and 4B show schematic illustrations of a micromechanical component, which does not fall within the scope of the present invention.
Figure 4B:
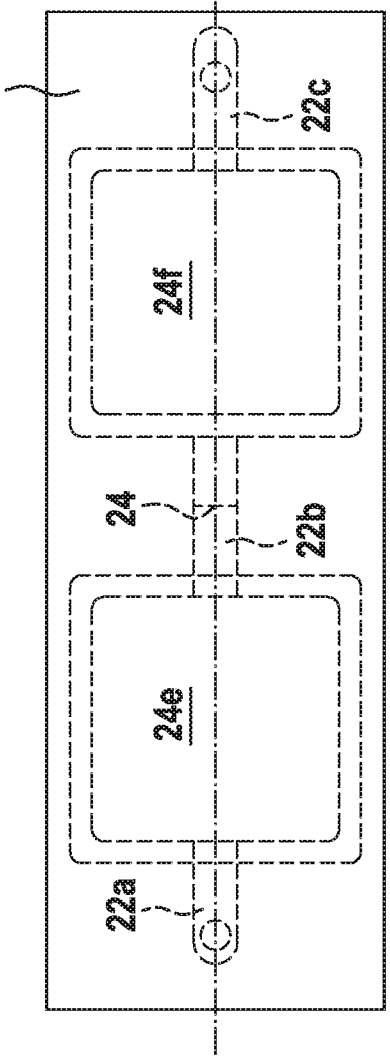

FIGS. 4A and 4B show schematic illustrations of a micromechanical component that does not fall within the scope of the present invention.

As may be seen in FIG. 4A, which shows a cross section through monocrystalline sealing layer 24, it is also possible to form, by way of the method steps explained in connection with FIGS. 1A and 1B, a first cavity 20e and a second cavity 20f within the monocrystalline substrate 12 in such a way that a first extent $a_e$ of the first cavity 20e oriented perpendicularly to substrate surface 12a of monocrystalline substrate 12 is unequal to a second extent $a_f$ of the second cavity 20f oriented perpendicularly to substrate surface 12a. A first access opening 26e and a second access opening 26f are respectively patterned through the back side 12b of monocrystalline substrate 12 in such a way that for example a gaseous or liquid medium may be conducted through first access opening 26e and a first access channel 22a into cavity 20e, from there via a second access channel 22b into second cavity 20f and from there may be conducted out again via third access channel 22c and second access opening 26f. The gaseous or liquid medium may also be conducted in the opposite direction.

The micromechanical component of FIGS. 4A and 4B is implemented as a micromechanical dynamic pressure sensor by way of example, it being possible to use a first partial area 24e of monocrystalline sealing layer 24 covering sensor cavity 20e as a first pressure-sensitive diaphragm 24e and to use a second partial area 24f of the monocrystalline sealing layer 24 covering sensor cavity 20f as a second pressure-sensitive diaphragm 24f (see top view onto monocrystalline sealing layer 24 in FIG. 4B). While a first pressure $p_1$ of the gaseous or liquid medium is measured by way of the first pressure-sensitive diaphragm 24e, a second pressure $p_2$ of the gaseous or liquid medium is ascertained by way of the second pressure-sensitive diaphragm 24f. Due to the fact that a first extent $a_e$ of first cavity 20e oriented perpendicularly to substrate surface 12a of monocrystalline substrate 12 is unequal to a second extent $a_f$ of second cavity 20f oriented perpendicularly to substrate surface 12a, conducting a gaseous or liquid medium through first access opening 26e and second access opening 26f results in the formation of a first pressure $p_1$ and a first flow velocity $v_1$ of the gaseous or liquid medium in the area of the first pressure sensitive diaphragm 24e and in the formation of a second pressure $p_2$ and a second flow velocity $v_2$ of the gaseous or liquid medium in the area of the second pressure-sensitive diaphragm 24f. With the aid of the known Bernoulli equation, the measured pressure difference between the first pressure $p_1$ and the second pressure $p_2$ may be used to determine the flow velocities $v_1$ and $v_2$ and/or the volumetric flow of the conducted gaseous or liquid medium.

To determine the first pressure $p_1$ and the second pressure $p_2$, at least one piezoresistive resistor (not shown) may be integrated both in the first partial area 24e of monocrystalline sealing layer 24 used as the first pressure-sensitive diaphragm 24e as well as in the second partial area 24f of monocrystalline sealing layer 24 used as the second pressure-sensitive diaphragm 24f. A piezoelectric dynamic pressure sensor is realized in this manner. With the aid of a further layer construction (not shown), it is also possible to determine the first pressure $p_1$ and the second pressure $p_2$ capacitively.

Regarding further features of the micromechanical component of FIGS. 4A and 4B, reference is made to the description of FIGS. 1A through 1D and of FIG. 2.

Figure 5:
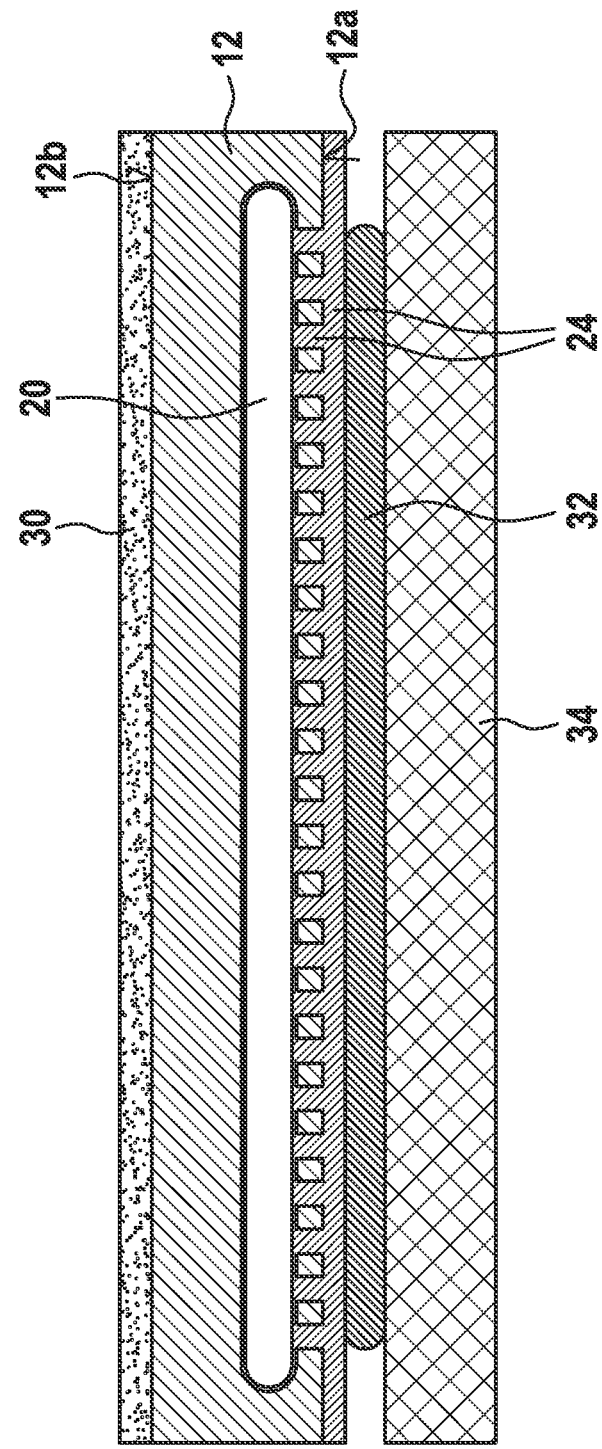
FIG. 5 shows a schematic illustration of a micromechanical component, which does not fall within the scope of the present invention.

FIG. 5 shows a schematic illustration of a micromechanical component that does not fall within the scope of the present invention.

As represented schematically in FIG. 5, it is optionally possible to develop additionally a micromechanical and/or micro-electrical circuit 30 on the back side 12b of monocrystalline substrate 12. Furthermore, the micromechanical component may be attached to a printed circuit board (PCB) 34 or a housing surface by way of a bonding connection 32 contacting the monocrystalline sealing layer 24, such as for example a eutectic bonding connection, a seal glass connection, an adhesive connection or a soldered connection. This makes it possible reliably to counteract an introduction of stress into monocrystalline substrate 12. Printed circuit board 34 may be a ceramic printed circuit board, for example.

Regarding further features of the micromechanical component of FIG. 5, reference is made to the description of FIGS. 1A through 1D and of FIG. 2.

Figure 6A:
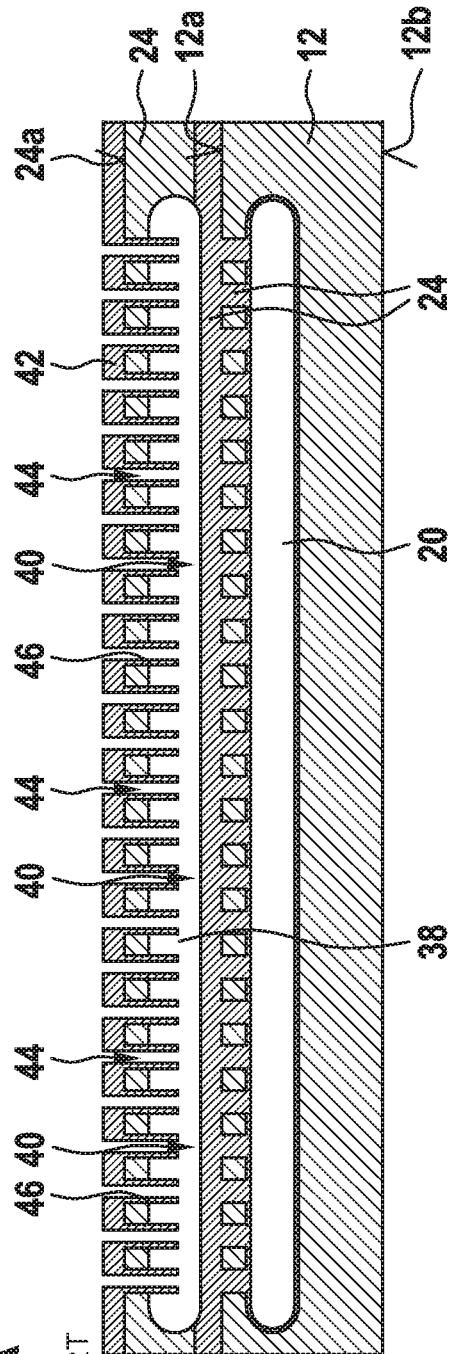
FIGS. 6A and 6B show schematic illustrations of layer sequences for explaining method steps, which do not fall within the scope of the present invention.
Figure 6B:
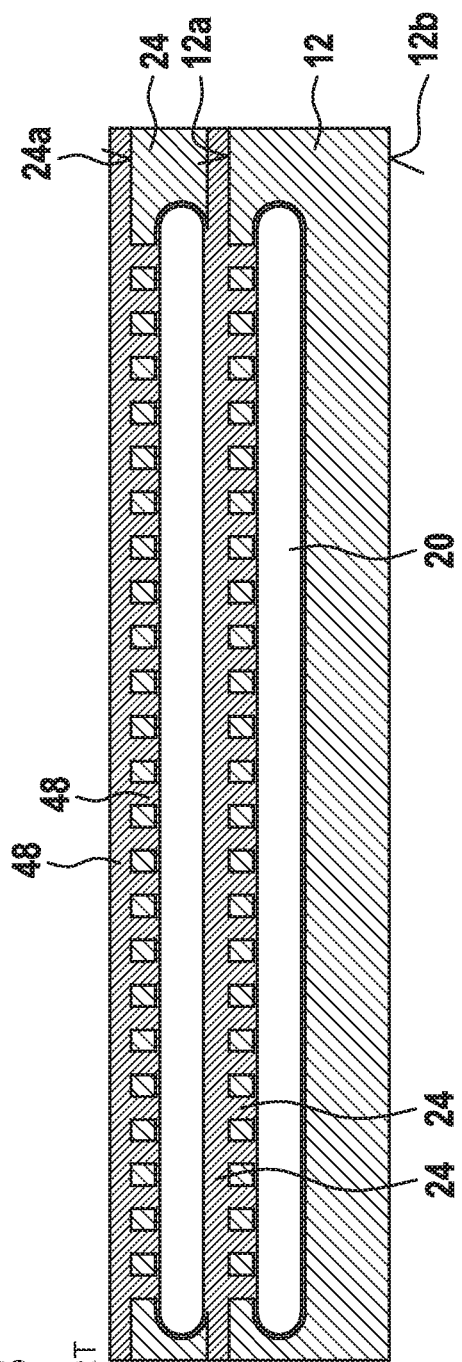

FIGS. 6A and 6B show schematic illustrations of layer sequences for explaining method steps that do not fall within the scope of the present invention.

In the production method represented schematically by FIGS. 6A and 6B, following the execution of the method steps explained in connection with FIGS. 1A and 1B, the same method steps are applied once more on/at the epitaxially grown monocrystalline sealing layer 24. FIG. 6A shows an intermediate product of the production method following a formation of at least one further cavity 38 in a monocrystalline sealing layer 24 covering/closing the at least one cavity 20 formed within monocrystalline substrate 12. Following a further execution of the method steps explained in connection with FIGS. 1A and 1B on/at the epitaxially grown monocrystalline sealing layer 24, it is optionally possible to form/deposit at least one semiconductor and/or metal layer and/or at least one insulating layer on and/or above monocrystalline sealing layer 48.

By way of example, in the specific embodiment described here, a monocrystalline sealing layer 24 is produced at a thickness that allows for the production of a further cavity 38 in sealing layer 24. Alternatively, a further monocrystalline layer may be grown on sealing layer 24, in order to produce a sufficiently thick monocrystalline layer. The further monocrystalline layer may be formed/deposited on monocrystalline sealing layer 24 from the at least one identical semiconductor material as monocrystalline substrate 12 and/or at least one other semiconductor material (than the at least one semiconductor layer). The further monocrystalline layer may also be made of silicon, for example. Moreover, in the production method described here, in order to form the at least one further cavity 38, first a plurality of trenches 40 are patterned through a surface 24a of monocrystalline sealing layer 24. The patterning of the plurality of trenches 40 occurs by way of a further anisotropic etching method, preferably by using an etching mask 42 having straight-through cut-outs 44 formed therein. For patterning the plurality of trenches 40 in a monocrystalline sealing layer 24, any conventional anisotropic etching method for this material may be carried out. Etching mask 42 may be made of silicon dioxide for example, which in the case of a monocrystalline sealing layer 24 made of silicon may be produced in particular by thermal oxidation. The lateral walls of the plurality of trenches 40 are then covered by a further passivation layer 46, while bottom areas of the plurality of trenches 40 are kept free or are freed of the further passivation layer 46. Passivation layer 46 may be for example a silicon dioxide layer, in the case of a monocrystalline sealing layer 24 made of silicon in particular a silicon dioxide layer formed by thermal oxidation, or a polymer layer.

Subsequently, the at least one further cavity 38 is etched into the monocrystalline sealing layer 24 using a further isotropic etching method, in which an etching medium of the further isotropic etching method is conducted through the plurality of trenches 40. As the further isotropic etching method, it is possible to perform for example a plasma etching process, such as specifically an SF6 plasma etching process, or a gas phase etching process, in particular a ClF3 gas phase etching process or an XeF2 gas phase etching process.

If the etching of the at least one cavity 38 occurs using etching mask 42 and/or passivation layer 46, etching mask 42 and/or passivation layer 46 are removed following the etching of the at least one further cavity 38. If etching mask 42 and/or passivation layer 46 are made of silicon dioxide, it is possible to perform e.g. an HF gas phase etching process to remove the respective layers 42 or 46 reliably.

FIG. 6B shows the micromechanical component following an epitaxial growth of a further monocrystalline sealing layer 48 on the surface 24a of monocrystalline sealing layer 24 made of the at least one identical semiconductor material as the monocrystalline sealing layer 24, whereby the plurality of trenches 40 is covered. If the monocrystalline sealing layer 24 is made of silicon, then a monocrystalline silicon layer is grown epitaxially as the further monocrystalline sealing layer 48. Optionally, following the epitaxial deposition of the further monocrystalline sealing layer 48, an annealing step may be performed in order to smooth out unwanted topographies/spikes in the at least one further cavity 38. The method/production steps leading to FIGS. 6A and 6B may be performed as often as desired for producing further cavities.

Regarding further method steps of the production method of FIGS. 6A and 6B, reference is made to the description of FIGS. 1A through 1D.

FIG. 7 shows a schematic illustration of a first specific development of the micromechanical component according to the present invention.

As a further development to previously explained specific embodiments, micromechanical component illustrated schematically in FIG. 7 additionally has at least one semiconductor and/or metal layer 36a through 36c and/or at least one insulating layer 50a through 50d as layer stack 52 on a side of its monocrystalline sealing layer 24 facing away from the at least one cavity 20 formed within monocrystalline substrate 12. Furthermore, the at least one semiconductor and/or metal layer 36a through 36c and/or the at least one insulating layer 50a through 50d surround at least one further cavity. Merely by way of example, layer stack 52 has, as the at least one semiconductor and/or metal layer 36a through 36c, a first silicon layer 36a, a second silicon layer 36b and a third silicon layer 36c facing away from monocrystalline sealing layer 24 as the outermost silicon layer 36c of layer stack 52, it being possible for a partial area of third silicon layer 36c adjacent to cavity 38a to be developed as a deformable diaphragm 53. As the at least one insulating layer 50a through 50d, layer stack 52 comprises by way of example a first silicon dioxide layer 50a covering monocrystalline sealing layer 24 at least partially, a silicon-rich silicon nitride layer 50b situated between first silicon dioxide layer 50a and first silicon layer 36a, a second silicon dioxide layer 50c situated between first silicon layer 36a and second silicon layer 36b, and a third silicon dioxide layer 50d situated between second silicon layer 36b and third silicon layer 36d. Layers 36a through 36c and 50a through 50d, however, are only to be interpreted in exemplary fashion.

The micromechanical component illustrated schematically in FIG. 7 may be produced by way of the method steps explained in connection with FIGS. 1A, 1B, 6A and 6B. At least one connecting channel 54 is also formed in the process, by which the at least one cavity 20 formed within monocrystalline substrate 12 is connected to the at least one cavity 38a embedded in layer stack 52.

The at least one cavity 20 formed within monocrystalline substrate 12 is thus connected to cavity 38a embedded in layer stack 52 via the at least one connecting channel 54. The at least one purposefully introduced connecting channel 54 allows for an exchange of gas between the at least one cavity 38a embedded in layer stack 52 and the at least one cavity 20 formed within monocrystalline substrate 12. Outgassing substances, such as for example hydrogen, nitrogen, oxygen (e.g. outgassed from TEOS, tetraethyl orthosilicate), doping substances and carbonaceous gases forming in the process, such as in particular methane or ethane, are thus able to spread out in a larger volume across the cavities 20 and 38a connected to each other via the at least one connecting channel 54. One can also paraphrase the interconnection of cavities 20 and 38a via the at least one connecting channel 54 as a "volume enlargement" of cavity 38a. In an appropriately enlarged cavity volume, an identical quantity of outgassing substances results in a smaller change of the internal pressure. Outgassing effects within cavity 38a, as they occur in particular at higher temperatures, therefore have hardly any influence on pressure measurements performed using deformable diaphragm 53.

In conventional pressure sensors, outgassing effects frequently result in an increase of an internal pressure in a hollow space of the respective pressure sensor and thus in a drift of sensor signals of the respective pressure sensor. In contrast, in the micromechanical component of FIG. 7, the at least one cavity 20 formed within monocrystalline substrate 12 is usable as a "buried hollow space" for the "enlargement of the cavity volume" of the at least one cavity 38a embedded in layer stack 52. A "volume enlargement" of the at least one cavity 38a embedded in layer stack 52 is thereby achieved, which attenuates the consequences of outgassing effects. Accordingly, the outgassing substances hardly result in an impairment of a sensor function and/or a sensor signal stability when performing pressure measurements using the deformable diaphragm 53 bounding cavity 38a.

As an advantageous development, it is also possible to use the at least one cavity 20 formed within monocrystalline substrate 12 and the at least one connecting channel 54 to conduct an etching gas from outside the micromechanical component into the volume of the at least one subsequent cavity 38a of layer stack 52 in order to expose the at least one cavity 38a embedded in layer stack 52. To expose the at least one cavity 38a embedded in layer stack 52, it is possible to perform a sacrificial oxide layer etching process for example, such as in particular HF gas phase etching. Moreover, the at least one cavity 20 formed within monocrystalline substrate 12 and the at least one connecting channel 54 also contribute toward decoupling the stress of the micromechanical component.

Regarding further features of the micromechanical component of FIG. 7, reference is made to the description of FIGS. 1A through 1D, of FIG. 2 and of FIGS. 6A and 6B.

Figure 8A:
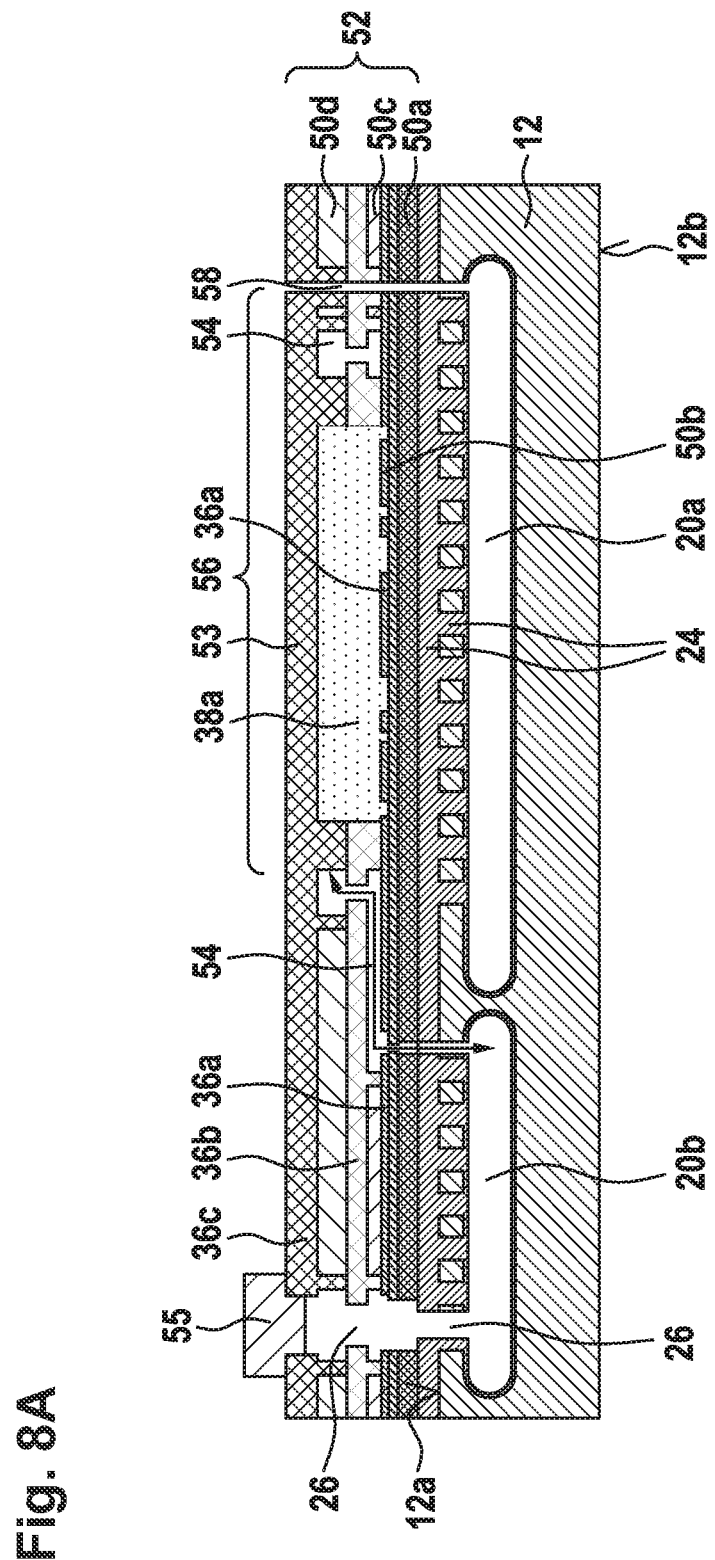
FIGS. 8A and 8B show schematic illustrations of a second specific embodiment of the micromechanical component according to the present invention.
Figure 8B:
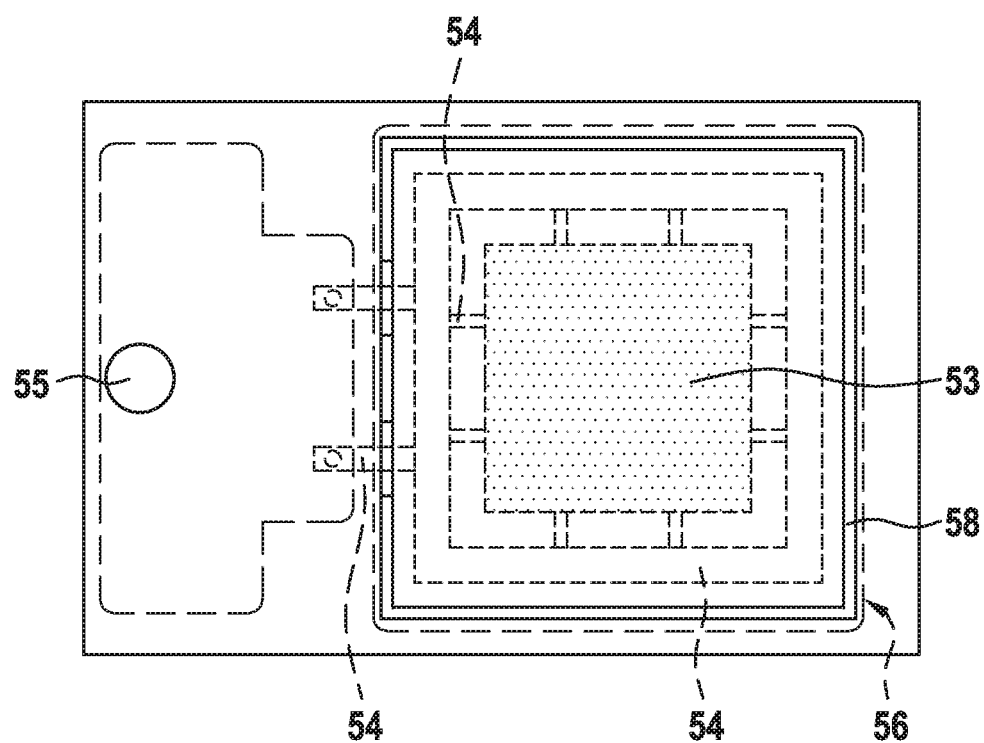

FIGS. 8A and 8B show schematic illustrations of a second specific embodiment of the micromechanical component according to the present invention.

In the micromechanical component illustrated schematically in FIGS. 8A and 8B, an exchange of gas between the at least one cavity 38a embedded in layer stack 52 and the at least one cavity 20b developed within monocrystalline substrate 12 is also possible via the at least one connecting channel 54, so that outgassing substances have hardly any influence on an internal pressure in the cavity 38a used for pressure measurements. An access opening 26 opening into cavity 20b may be sealed by a closure 55 in a media-tight manner.

Furthermore, a sensing area 56 equipped with the cavity 38a used for pressure measurements is separated/insulated from a remaining area of the micromechanical component by a trench 58 surrounding sensing area 56 at least partially and by a cavity 20a formed on a side facing away from deformable diaphragm 53 of cavity 38a, which is formed within monocrystalline substrate 12 and into which trench 58 opens. A low-stress suspension of sensing area 56 is thus realized by trench 58 and by cavity 20a formed within monocrystalline substrate 12.

Regarding further features of the micromechanical component of FIGS. 8A and 8B, reference is made to the description of FIGS. 1A through 1D, of FIG. 2, of FIGS. 6A and 6B and of FIG. 7.

Figure 9:
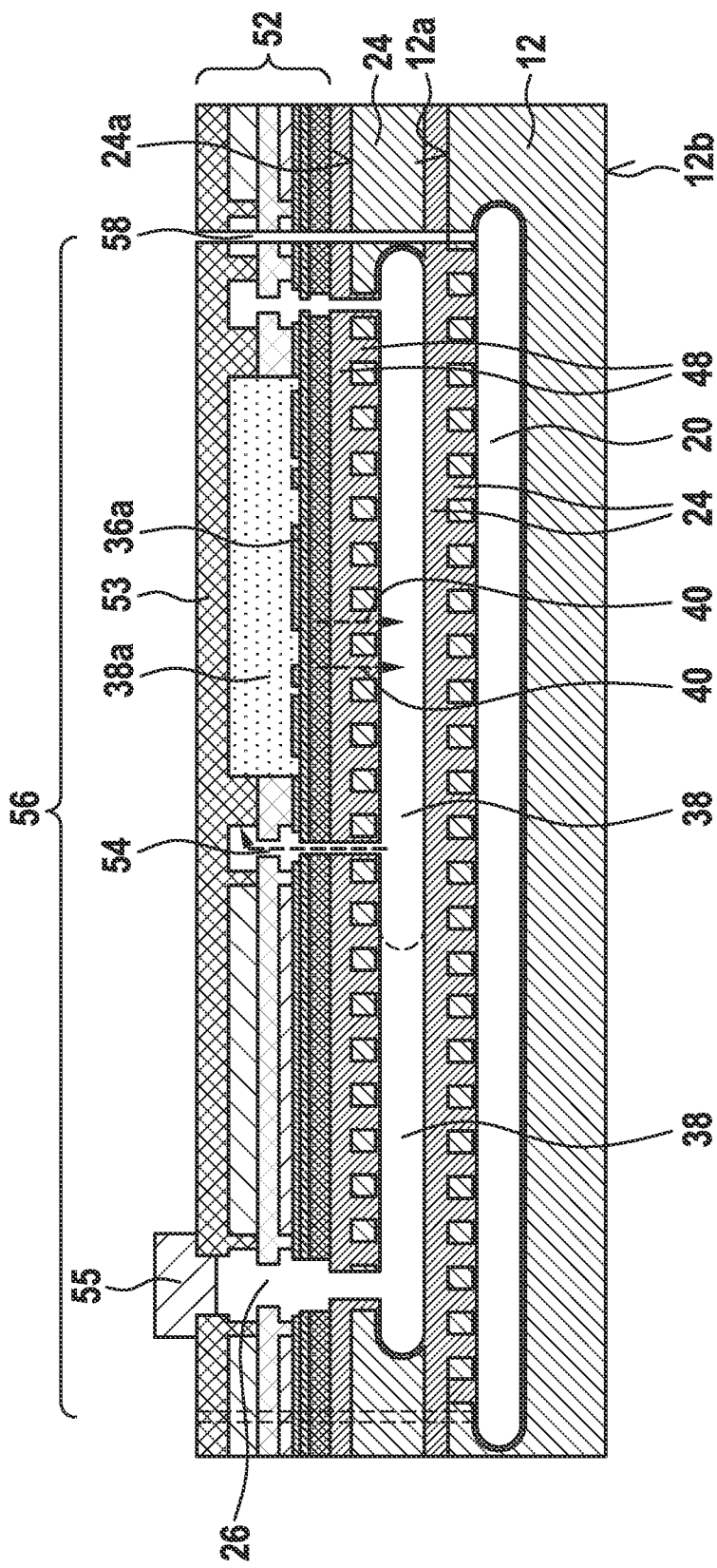
FIG. 9 shows a schematic illustration of a third specific embodiment of the micromechanical component according to the present invention.

FIG. 9 shows a schematic illustration of a third specific development of the micromechanical component according to the present invention.

The micromechanical component illustrated schematically in FIG. 9 is a combination of the specific embodiments of FIG. 6B and FIG. 7. For this purpose, the micromechanical component comprises a monocrystalline sealing layer 24 having a thickness that allows for the production of at least one cavity 38 within monocrystalline sealing layer 24. A plurality of second trenches 40 patterned through the surface 24a of monocrystalline sealing layer 24, which opens into at least one cavity 38 embedded in monocrystalline sealing layer 24, are covered, in particular completely filled/closed by a further monocrystalline sealing layer 48, epitaxially grown on surface 24a of monocrystalline sealing layer 24 and made of the at least one identical semiconductor material as monocrystalline layer 36. In addition, the layer stack 52 already described above is formed with at least one cavity 20 developed in the layer stack 52 on the further monocrystalline sealing layer 48.

Regarding further features of the micromechanical component of FIG. 9, reference is made to the description of FIGS. 1A through 1D, of FIG. 2, of FIGS. 6A and 6B, of FIG. 7 and of FIGS. 8A and 8B.

The micromechanical components described above and the products obtained by the production methods explained above may be used as (parts of) pressure sensors such as piezoresistive pressure sensors or capacitive pressure sensors, temperature sensors, micromirrors, micromechanical valves, micromechanical pumps and/or inertial sensors.

As a further development, in all of the specific embodiments described above, local support structures (e.g. made of silicon) may be additionally developed in the cavities 20, 20a, 20b, 20c, 20d, 20e, 20f, 22, 38 and 38a for increasing the stability of sealing layer 24 or 48 or of the diaphragm structures produced by the latter. The extents, positions and shapes of the local support structures may be selected with great freedom of design. Alternatively, in all of the specific embodiments described above, cavities 20, 20a, 20b, 20c, 20d, 20e, 20f, 22, 38 and 38a and sensing area 56 may be developed further by an at least partially circumferential trench 58 as a stress-optimized-decoupled sensing area 56.

It is pointed out once more that cavities 20, 20a, 20b, 20c, 20d, 20e, 20f, 22, 38 and 38a may be developed in any position of the respective specific embodiment and in a multitude of different shapes. It is also pointed out once more that, in addition to volume expansion, cavities 20, 20a, 20b, 20c, 20d, 20e, 20f, 22, 38 and 38a and their access channels 22, 22a, 22b and 22c may also be used for supplying a sacrificial layer etching medium.

What is claimed is:

1. A production method comprising the following steps:
patterning a plurality of first trenches through a substrate surface of a monocrystalline substrate, the monocrystalline substrate being made of at least one semiconductor material, using an anisotropic etching method;
covering lateral walls of the plurality of first trenches with a passivation layer, while bottom areas of the plurality of first trenches are kept free or are freed of the passivation layer;
etching at least one first cavity, into which the plurality of first trenches open, into the monocrystalline substrate using an isotropic etching method, in which an etching medium of the isotropic etching method is conducted through the plurality of first trenches;
covering the plurality of first trenches by epitaxially growing a monocrystalline sealing layer on the substrate surface of the monocrystalline substrate, wherein the monocrystalline sealing layer is made of at least one identical semiconductor material as the monocrystalline substrate;
forming at least one semiconductor and/or metal layer and/or at least one insulating layer, as a layer stack on and/or over the monocrystalline sealing layer on a side of the monocrystalline sealing layer facing away from the at least one first cavity; and
forming at least one second cavity by removing at least one partial area of the at least one semiconductor and/or metal layer and/or of the at least one insulating layer on the side of the monocrystalline sealing layer oriented away from the at least one first cavity, with a remaining portion of the at least one semiconductor and/or metal layer and/or of the at least one insulating layer surrounding the at least one second cavity;

wherein:

the production method results in a micromechanical component for a sensor or microphone device, the micromechanical component including:

the monocrystalline substrate made of the at least one semiconductor material, with the plurality of first trenches (a) patterned through the substrate surface of the monocrystalline substrate and (b) opening into the at least one first cavity etched into the monocrystalline substrate;

the monocrystalline sealing layer that (a) is epitaxially grown on the substrate surface of the monocrystalline substrate, (b) is made of the at least one identical semiconductor material as the monocrystalline substrate, and (c) covers the plurality of first trenches; and the remaining portion of the at least one semiconductor and/or metal layer and/or at least one insulating layer that (a) is formed as the layer stack on the side of the monocrystalline sealing layer facing away from the at least one first cavity and (b) surrounds at least one second cavity; and in the resulting micromechanical component:

a partial area, adjoining the at least one second cavity, of an outermost silicon layer of the layer stack is developed as a deformable diaphragm; and at least one connecting channel is formed, by which the at least one first cavity formed within the monocrystalline substrate is connected to the at least one second cavity embedded in the layer stack.

2. The production method as recited in claim 1, wherein the monocrystalline sealing layer is epitaxially grown as a monocrystalline silicon layer on the monocrystalline substrate made of silicon.

3. A micromechanical component for a sensor or microphone device, comprising:

a monocrystalline substrate made of at least one semiconductor material, a plurality of first trenches being patterned through a substrate surface of the monocrystalline substrate, wherein the plurality of first trenches open into at least one first cavity etched into the monocrystalline substrate;

a monocrystalline sealing layer that (a) is epitaxially grown on the substrate surface of the monocrystalline substrate, (b) is made of at least one identical semiconductor material as the monocrystalline substrate, and (c) covers the plurality of first trenches; and at least one semiconductor and/or metal layer and/or at least one insulating layer, formed as a layer stack on a side of the monocrystalline sealing layer facing away from the at least one first cavity, the at least one semiconductor and/or metal layer and/or the at least one insulating layer surrounding at least one second cavity;

wherein a partial area, adjoining the at least one second cavity, of an outermost silicon layer of the layer stack is developed as a deformable diaphragm, and at least one connecting channel is formed, by which the at least one first cavity formed within the monocrystalline substrate is connected to the at least one second cavity embedded in the layer stack.

* * * * *